(12) United States Patent
Gu et al.

(10) Patent No.: US 6,794,304 B1
(45) Date of Patent: Sep. 21, 2004

(54) METHOD AND APPARATUS FOR REDUCING MICROTRENCHING FOR BORDERLESS VIAS CREATED IN A DUAL DAMASCENE PROCESS

(75) Inventors: Shiqun Gu, Vancouver, WA (US); Masaichi Eda, Gresham, OR (US); Peter McGrath, Portland, OR (US); Hong Lin, Vancouver, WA (US); Jim Elmer, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/631,528

(22) Filed: Jul. 31, 2003

(51) Int. Cl.⁷ ...................... H01L 21/302; H01L 21/461
(52) U.S. Cl. ........................ 438/740; 438/742; 438/754
(58) Field of Search ................................ 438/740, 689, 438/692, 700, 722, 706, 738, 742, 745, 754

(56) References Cited

U.S. PATENT DOCUMENTS 5,856,641 A  *  1/1999  Schreiber et al. ........... 200/1 B
5,946,555 A  *  8/1999  Crumly et al. .............. 438/125
6,541,157 B1 *  4/2003  Inagaki et al. ........... 429/231.9
6,734,057 B2 *  5/2004  Lian et al. .................. 438/240

* cited by examiner

Primary Examiner—David Nhu
(74) Attorney, Agent, or Firm—Maginot, Moore & Bowman LLP

(57) ABSTRACT

A method of making a semiconductor device includes providing a first element formed of a first substantially electrically conductive material and having an upper surface. A second element adjacent to the first element is provided. The second element is formed of a first substantially non-electrically conductive material. An upper surface of the second element slopes downwardly toward the upper surface of the first element. A first layer of a second substantially non-electrically conductive material is disposed over the upper surface of the first element and the upper surface of the second element. The first layer has a thickness in the vertical direction that is greater in an area over the downward slope of the second element than in an area over the first element. An etching process is performed such that the layer is perforated above the upper surface of the first element and imperforated in the vertically thicker area above the downwardly sloping upper surface of the second element.

20 Claims, 8 Drawing Sheets

METHOD AND APPARATUS FOR REDUCING MICROTRENCHING FOR BORDERLESS VIAS CREATED IN A DUAL DAMASCENE PROCESS

TECHNICAL FIELD OF THE INVENTION

The present invention relates generally to semiconductor fabrication, and more particularly to a dual damascene process used in semiconductor fabrication.

BACKGROUND OF THE INVENTION

In the field of semiconductor fabrication, a pathway, hole, or other passage through a substrate of an integrated circuit is known as a "via". The via can be filled with an electrically conductive material, such as a metal, so that electrical current can flow to or from a metal line, i.e., a metal contact, that is embedded in the substrate at an end of the via.

During the formation of an integrated circuit, transistor devices are fabricated on semiconductor material, such as silicon. A dielectric layer is deposited over the transistor devices. Conductive plugs extend from the bottom surface to the top surface of the dielectric layer, enabling electrical contact with the transistors to be achieved through the dielectric layer. A film having a low dielectric constant K is then deposited over the dielectric layer. Metal lines extend from the bottom surface to the top surface of the low K film, enabling electrical contact with the conductive plugs and the transistors to be achieved through the low K film. Thus, the metal lines can be used to electrically connect the outside world to the transistors within the integrated circuit.

The low K film with the metal lines embedded therein is further covered with an insulating layer of electrically nonconductive material. Thus, the metal line is disposed below the upper surface of the integrated circuit. By forming a via through the nonconductve material and filling the via with conductive material, it is possible to make an electrical connection to the metal line at different vertical levels, thereby allowing access to the metal line from outside of the integrated circuit. Such arrangements are used to provide external contacts for integrated circuits.

Figure 1:
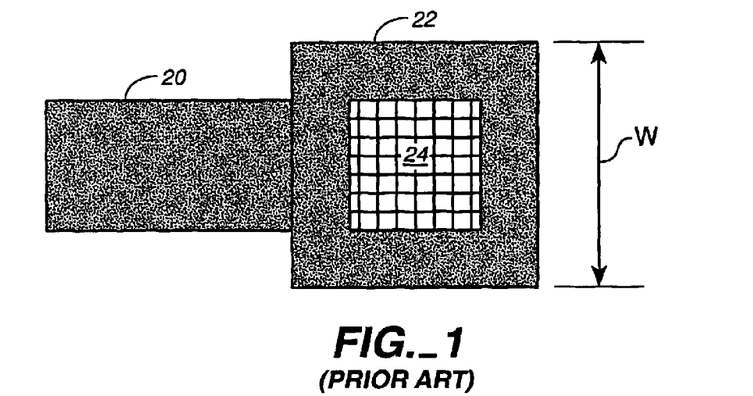
FIG. 1 is a top view of a metal line including a landing pad aligned with a via according to the prior art.

In the lithography process of semiconductor fabrication, an attempt is made to create the via in a location that is aligned with the underlying metal line so that electrical communication can be established between the metal line and an electrically conductive material that will fill the via. In order to make the alignment easier, it is known to provide the metal line with an area of increased width, known as a "landing pad", through which the metal line makes electrical contact with the conductive material inside the via. FIG. 1 illustrates a metal line 20 having such a landing pad 22 of increased width W. The landing pad 22 is aligned with a via 24.

In order to minimize circuit size and maximize transistor density, the widths of metal lines and vias have been reduced in succeeding generations of devices. However, the extra widths required by the above-described landing pads limit the achievable increase in circuit density. For this reason, the excess width accorded to landing pads have been all but eliminated, or at least reduced to less than one nanometer. Such structures, wherein the width of the landing pad is substantially equal to the width of the connected via, are known as "borderless structures", or "borderless vias".

Figure 2:
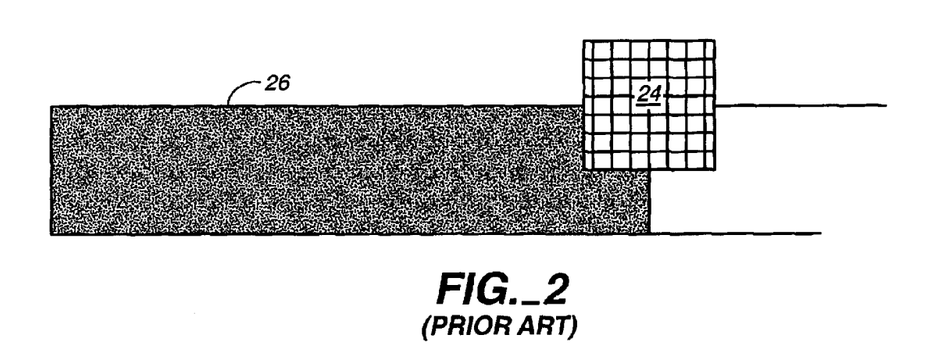
FIG. 2 is a top view of a via misaligned with another embodiment of a metal line according to the prior art.

The elimination of the extra width of the landing pad makes alignment of the via to the metal line difficult in such borderless vias. During the lithography process, the alignment of the via to the underlying metal line cannot be controlled to less than about ten nanometers misalignment due to inherent tool and processing issues. FIG. 2 illustrates the results of an inadvertent misalignment between a via 24 and an underlying metal line 26, resulting in the via 24 being partially disposed outside the borders of the metal line 26.

FIGS. 3a–3e illustrate the steps of an exemplary dual damascene process in which inadvertent misalignment between a via and a metal line occurs. In dual damascene processing, a thin layer 28 (FIG. 3a) of a material having a low dielectric constant K, such as silicon oxide (SiO), is disposed on a semiconductor wafer (not shown). The thickness of the silicon oxide layer 28 can be approximately between 0.5 and 1.0 micrometer. A trench or channel is etched in the silicon oxide layer 28, and a diffusion barrier layer 30 of tanium/tanium nitride (Ta/TaN) is disposed on the silicon oxide layer 28. A layer 32 of copper (Cu) is disposed on the barrier layer 30 by electrical plating such that the trench in the oxide layer 28 is filled with copper, and the whole surface of the wafer is covered with copper. The barrier layer 30 prevents the copper from diffusing into the oxide layer 28.

Figure 3A:
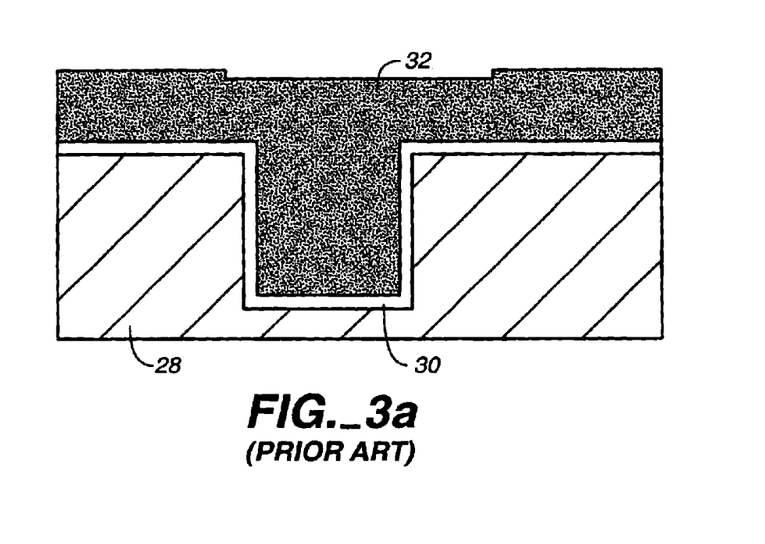
FIGS. 3a–3e are cross-sectional views of the creation of a via in a dual damascene process according to the prior art.
Figure 3B:
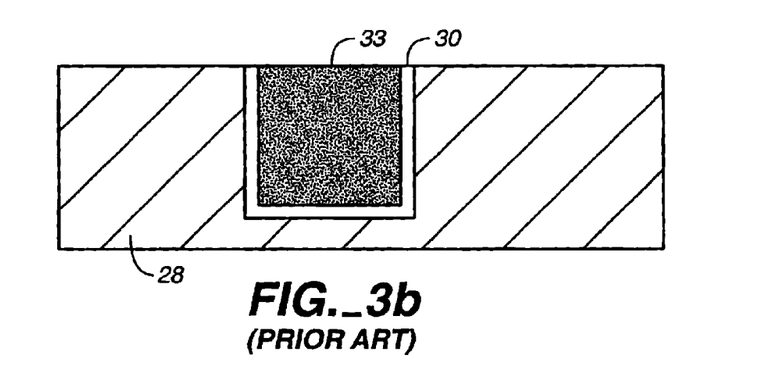

FIG. 3b illustrates the results of a chemical mechanical planarization (CMP) process that removes the copper layer 32 and the barrier layer 30 until the top surface of the oxide layer 28 is reached. The remaining copper layer 32 forms a metal line 33. An etch stop barrier layer 34 (FIG. 3c) of silicon carbide (SiC) is then disposed on the wafer such that the etch stop barrier layer 34 is substantially planar. The etch stop barrier layer 34 can alternatively be composed of $SiO_xC_yN_z$, wherein It is possible for any one or two of x, y and z to be zero. That is, the etch stop barrier layer 34 can be composed of $SiO_xC_yN_z$, $SiO_xC_y$, $SiO_xN_z$, $SiC_yN_z$, $SiO_x$, $SiC_y$, or $SiN_z$.

Next, an intermetal dielectric (IMD) layer 36 (FIG. 3d) of a material having a low dielectric constant K, such as $SiO_xC_yH_z$, SiOF, $SiO_x$, or carbon based film, is disposed over the entire surface of the wafer. The etch stop barrier layer 34 prevents diffusion of the copper from the metal line 33 into the IMD layer 36.

Figure 3C:
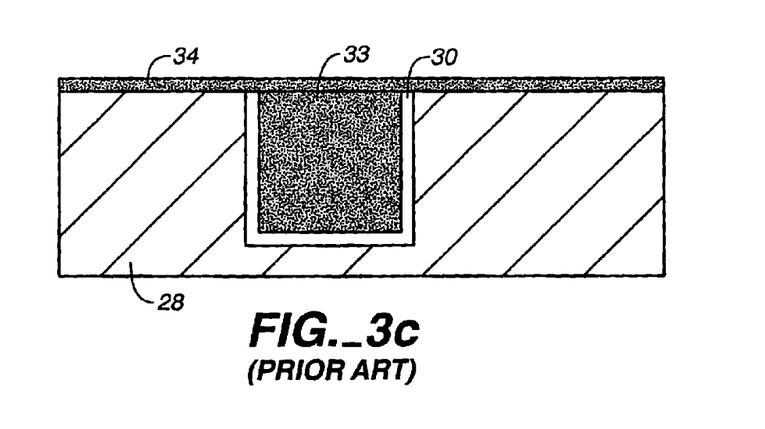
Figure 3D:
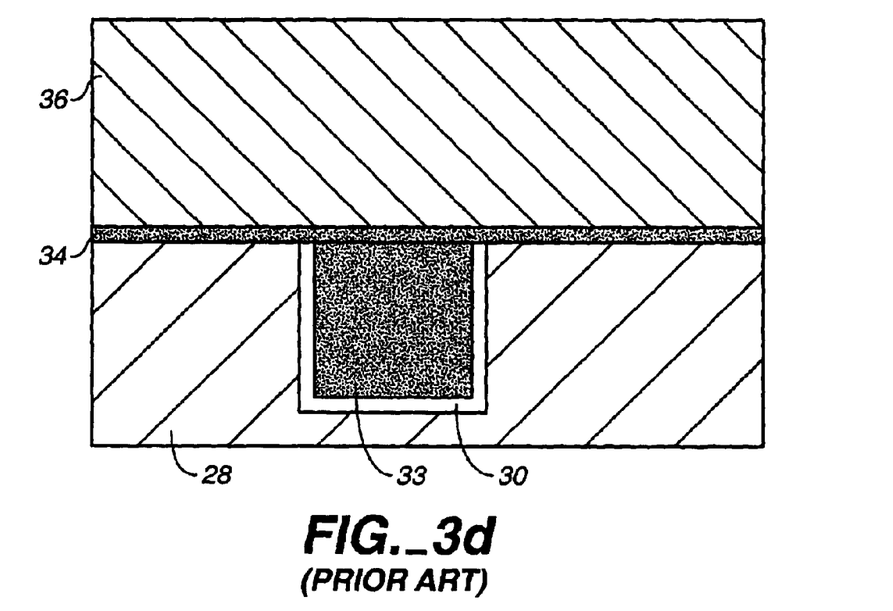
Figure 3E:
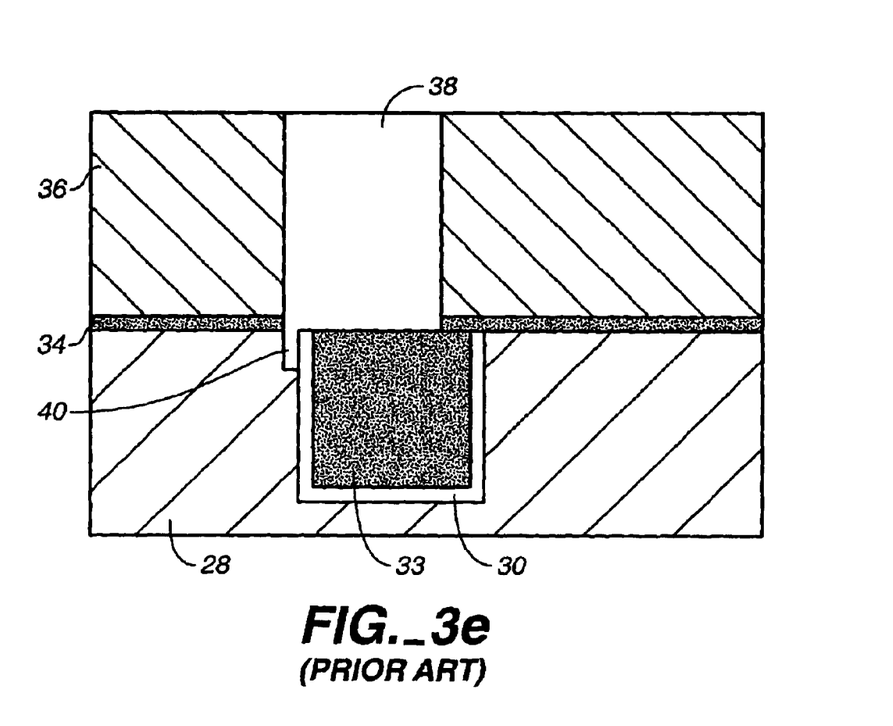

As illustrated in FIG. 3e, a plug hole is plasma etched in the IMD layer 36 in order to form a via 38. Due to machine limitations, the via 38 has been inadvertently misaligned with the metal line 33, as often occurs. The rate of vertical progression of the etch process is slower through the etch stop barrier layer 34 than through the IMD layer 36 because the etch process is designed and optimized for the material composition of the IMD layer 36. The etch stop barrier layer 34 is over-etched to ensure that all of the etch stop barrier layer 34 is removed from the top surface of the copper metal line 33, thereby allowing the copper to make good electrical contact with the conductive material to be inserted into the via 38.

After the etch stop barrier layer 34 has been etched through, the over-etching results in etching of the oxide layer 28 due to the poor selectivity between the etch stop barrier layer 34 and the oxide layer 28. The etching of the oxide layer 28 results in the formation of a microtrench 40 along the edge of the barrier layer 30. The rate of etch is faster through the oxide layer 28 than through the etch stop barrier layer 34, which tends to result in increasing the depth of the microtrench 40.

The formation of a microtrench 40 is undesirable because it is difficult for chemicals to penetrate into the microtrench 40. Thus, it is difficult to remove polymer from the microtrench 40 during a solvent cleaning process. It is also difficult to subsequently remove any solvent chemicals that manage to penetrate into the microtrench 40. Trapped solvent may corrode the metal line 33. Another problem associated with microtrenching is that the diffusion barrier layer 30 can be etched away from the side of the metal line 33 during the etching process, thereby reducing the reliability of the device. Yet another problem is that a microtrench provides a possible avenue for conductive bridging between adjacent metal lines.

One approach to solving the problems associated with microtrenching is to change the parameters of the etch process, such as gas flows, pressure, temperature and power, in order to improving the selectivity of the etch between the etch stop barrier layer 34 and the oxide layer 28. However, it has been found that it is difficult to achieve an acceptable level of selectivity because the oxide layer 28 has very weak resistance to the plasma etching.

What is needed in the art is a method of reducing microtrenching during the creation of borderless vias in a dual damascene process.

SUMMARY OF THE INVENTION

The present invention provides a method of increasing the effective thickness of the etch barrier layer in the areas where microtrenching could otherwise occur. Thus, the etch process is slowed down and inhibited from penetrating through the etch barrier layer in these areas of potential microtrenching.

In accordance with one embodiment of the present invention, there is provided a method of making a semiconductor device, including providing a first element formed of a first substantially electrically conductive material and having an upper surface. A second element adjacent to the first element is provided. The second element is formed of a first substantially non-electrically conductive material. An upper surface of the second element slopes downwardly toward the upper surface of the first element. A first layer of a second substantially nonelectrically conductive material is disposed over the upper surface of the first element and the upper surface of the second element. An etching process is performed such that the layer is perforated above the upper surface of the first element and imperforated above the downwardly sloping upper surface of the second element.

In accordance with another embodiment of the present invention, there is provided a method of making a semiconductor device, including providing a first element formed of a first substantially electrically conductive material. A second element adjacent to the first element is provided. The second element is formed of a first substantially non-electrically conductive material. A first layer of a second substantially non-electrically conductive material is disposed on the first element and the second element. The layer has a thickness relative to a predetermined direction. The thickness is greater along a junction between the first element and the second element than along the first element. An etching process is performed in the predetermined direction such that the layer is perforated along the first element and imperforated along the junction between the first element and the second element.

In accordance with yet another embodiment of the present invention, a semiconductor device is created by providing a first element formed of a first substantially electrically conductive material. A second element adjacent to the first element is provided. The second element is formed of a first substantially non-electrically conductive material. A first layer of a second substantially nonelectrically conductive material is disposed on the first element and the second element. The layer has a thickness relative to a predetermined direction. The thickness is greater along a junction between the first element and the second element than along the first element. An etching process is performed in the predetermined direction such that the layer is perforated along the first element and imperforated along the junction between the first element and the second element.

An advantage of the present invention is that microtrenching is avoided, thereby reducing the occurrence of bridging between metal lines and increasing device reliability and chip yield.

Another advantage is that the interconnect delay or response time of the device is reduced.

Yet another advantage is that improved lithography tolerances with respect to alignment can be tolerated.

A further advantage is that the etch barrier layer can be over-etched without resulting in microtrenching.

The above and other features and advantages of the present invention will become apparent from the following description and the attached drawings.

DETAILED DESCRIPTION OF A PREFERRED EMBODIMENT

The method of the present invention of making a semiconductor device including forming a via in a dual damascene process will now be described with reference to a preferred embodiment. Important properties and characteristics of the preferred embodiment-are illustrated in the structures in the text and in the accompanying drawings. While the invention will be described in conjunction with this preferred embodiment, it should be understood that the invention is not intended to be limited to this preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

FIGS. 4a–4j show stages in the formation of a via in a dual damascene process according to a preferred embodiment of the present invention. The formation of the via involves disposing a thin layer of silicon oxide on a semiconductor wafer, etching a trench in the silicon oxide layer, disposing a layer of tanium/tanium nitride (Ta/TaN) on the silicon oxide layer, disposing a layer of copper on the Ta/TaN layer, removing the copper layer until the top surface of the Ta/TaN layer is reached, an electrical polish back of the copper within the trench such that the exposed surface of the copper is recessed back in the silicon oxide layer, an etch back of the Ta/TaN layer and the silicon oxide layer such that the exposed surface of the Ta/TaN layer within the trench is recessed back in the silicon oxide layer, disposing an etch stop barrier layer, disposing an IMD layer, and etching a via hole through the IMD layer and the etch stop barrier layer down to the surface of the copper.

Figure 4A:
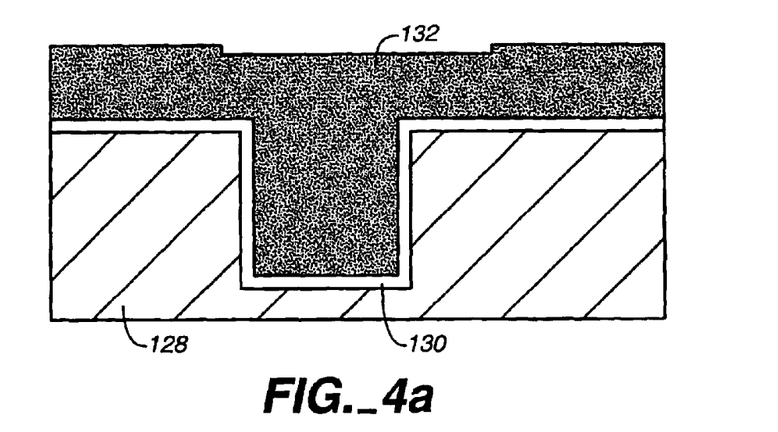
FIGS. 4a–4j are cross-sectional views of the creation of a via in a dual damascene process according to one embodiment of the method of the present invention.
Figure 4B:
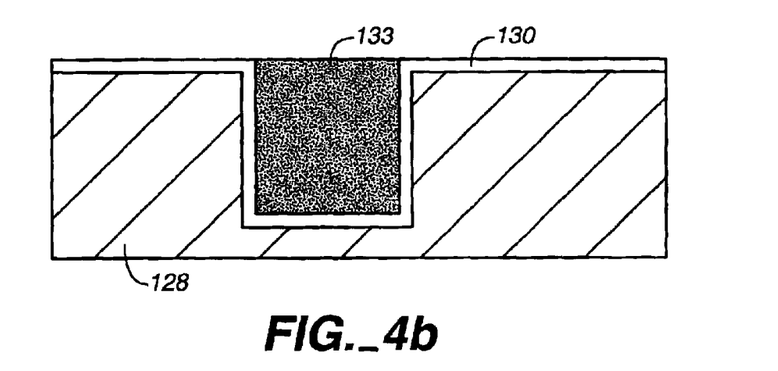
Figure 4C:
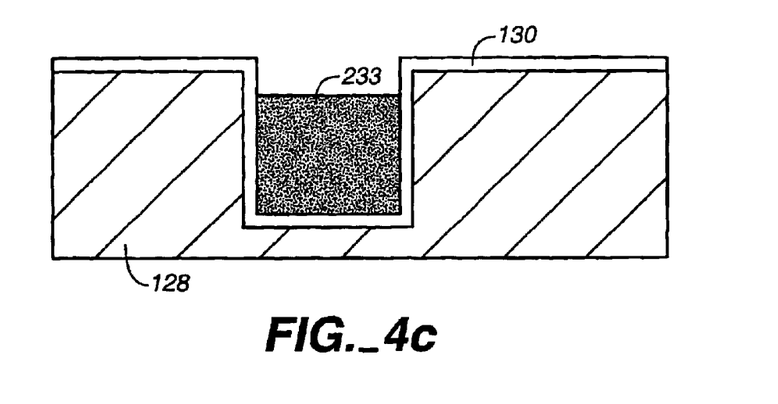
Figure 4D:
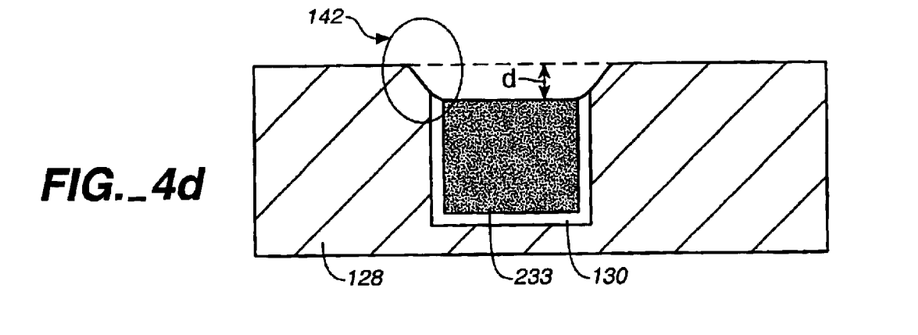
Figure 4E:
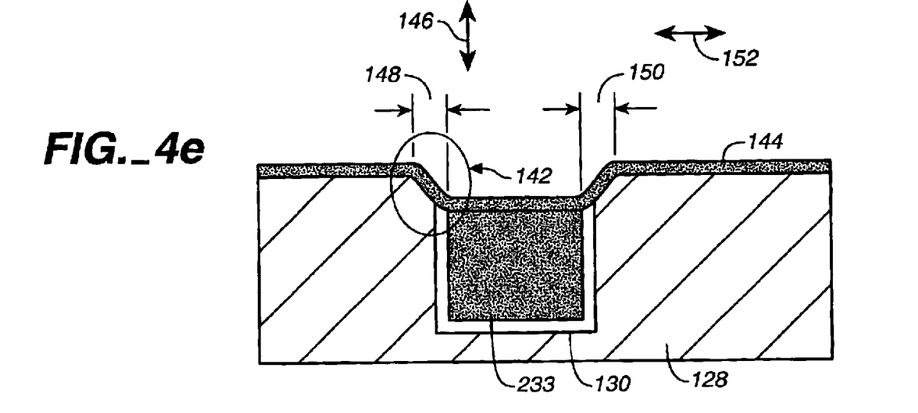
Figure 4F:
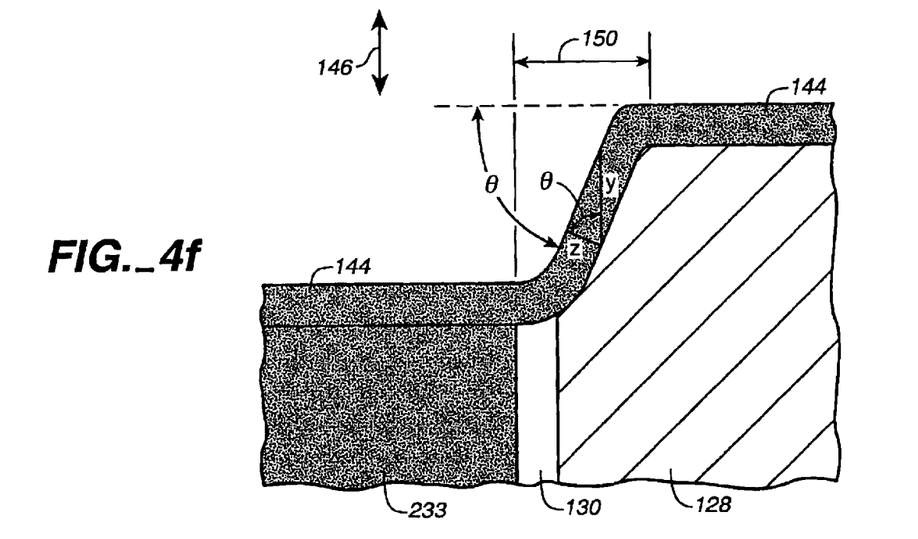
Figure 4G:
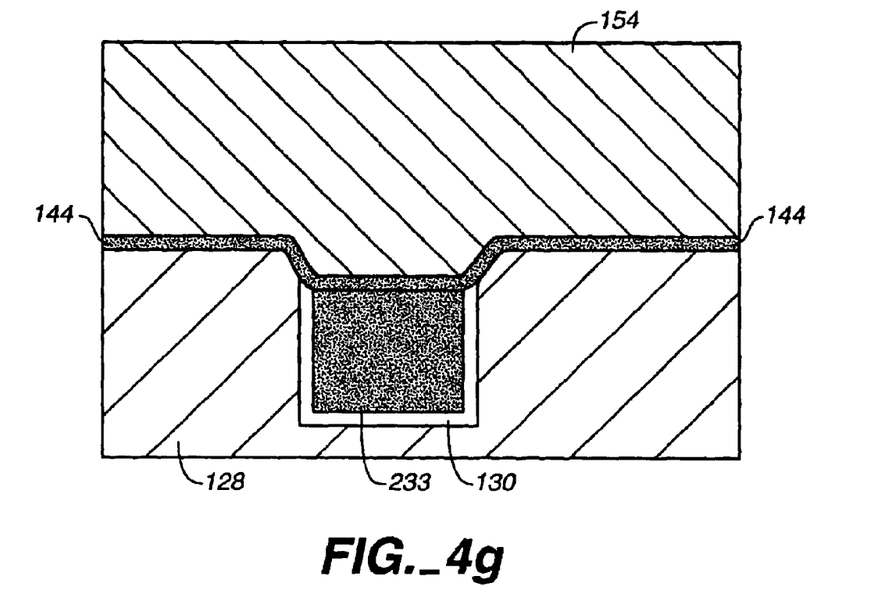
Figure 4H:
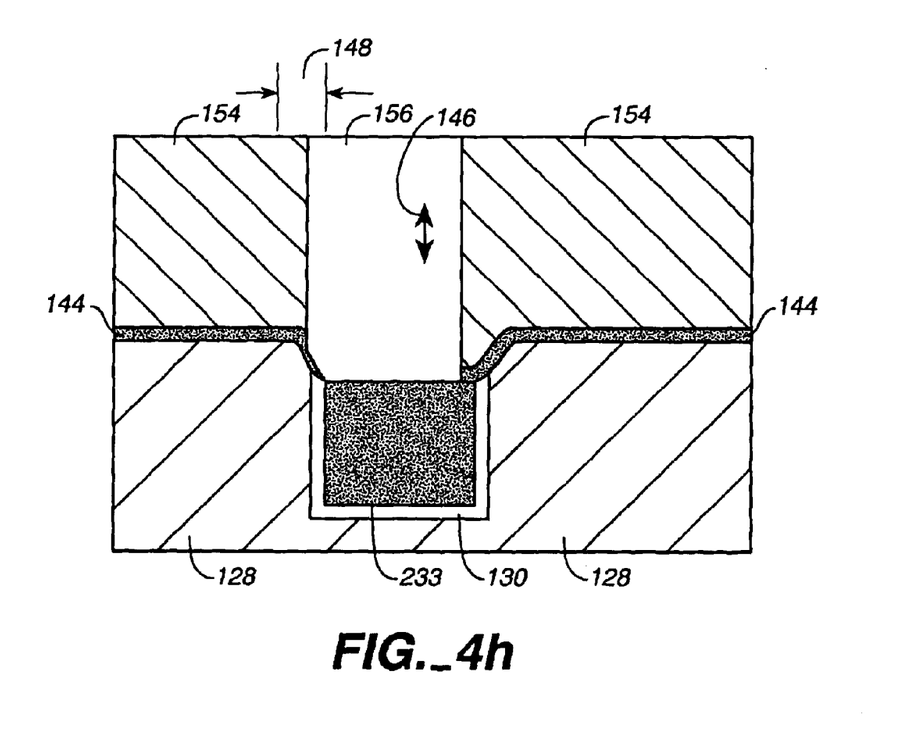
Figure 4I:
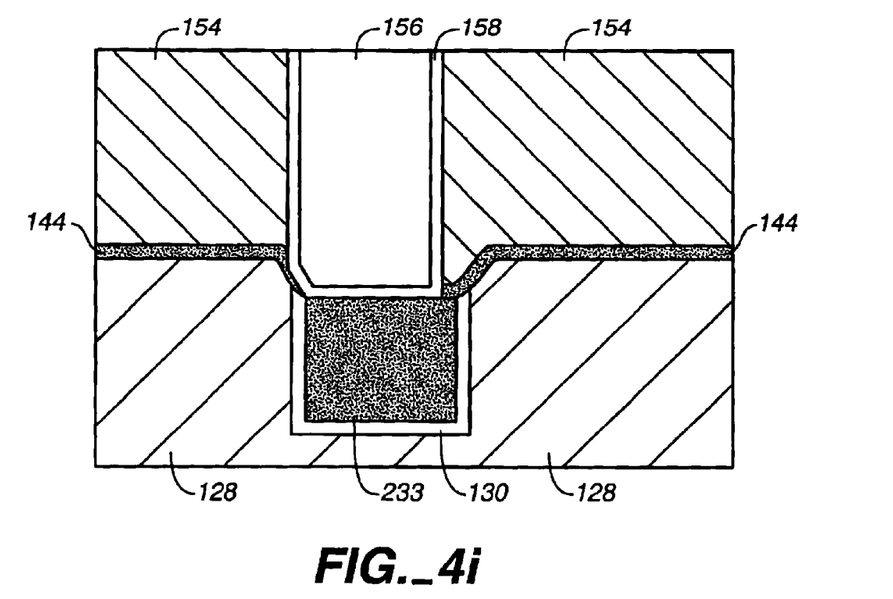
Figure 4J:
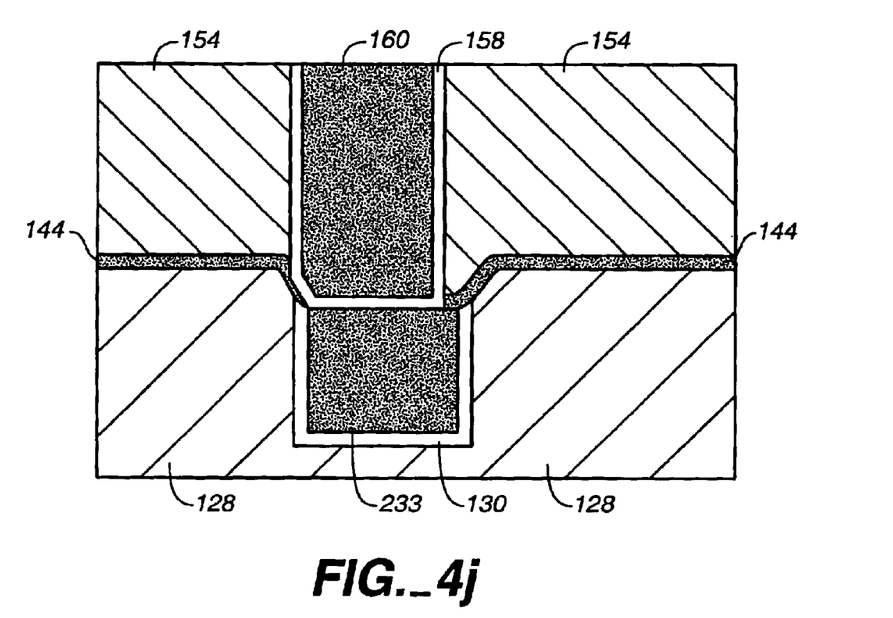
Figure 5:
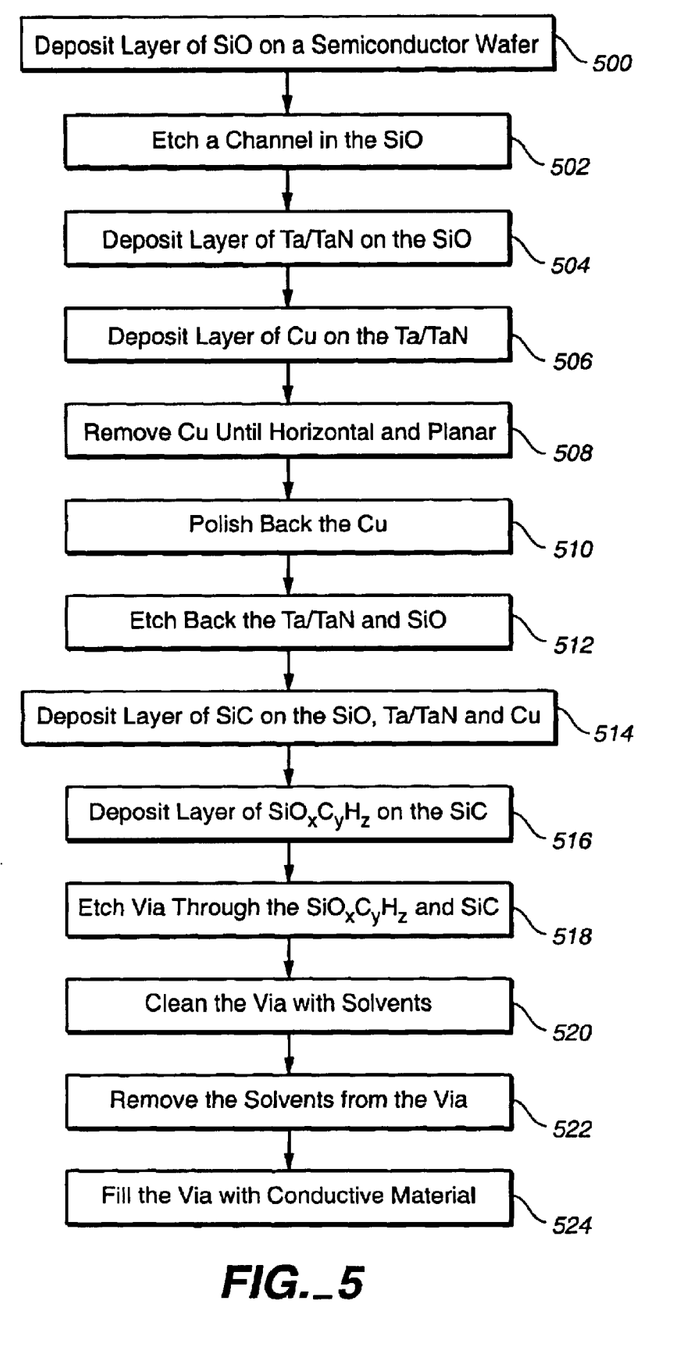
FIG. 5 is a flow chart of the preferred embodiment of the present invention depicted in FIGS. 4a–4j.

FIG. 5 shows a flow diagram of operations used to form the inventive stages of FIGS. 4a–4j. The steps of FIG. 5 and the stages of FIGS. 4a–4j will be described concurrently herein.

Referring to FIG. 4a, a dual damascene process includes disposing a thin layer or substrate 128 of a substantially non-electrically conductive material having a low dielectric constant K, such as silicon oxide (SiO), $SiO_xC_yH_z$, SiOF, $SiO_x$, or carbon based film, on a semiconductor wafer (not shown) (step 500; FIG. 5). Next, a trench or channel is etched in the silicon oxide layer 128 (step 502), and a diffusion barrier layer 130 of tanium/tanium nitride (Ta/TaN) is disposed on the silicon oxide layer 128 (step 504). In a preferred embodiment, the barrier layer 130 is deposited (through deposition) on the silicon oxide layer 128. A layer 132 of a substantially electrically conductive material, such as copper (Cu), is deposited on the Ta/TaN barrier layer 130 by electrical plating such that the trench in the silicon oxide layer 128 is filled with copper, and the whole surface of the wafer is covered with copper (step 506). A chemical mechanical planarization (CMP) process then removes the copper layer 132 until the top surface of the copper layer 132 is substantially horizontal and substantially planar (step 508). In a preferred embodiment, the copper layer 132 is removed until the top surface of the Ta/TaN barrier layer 130 is reached, as shown in FIG. 4b, thereby forming a metal line 133. Alternatively, it is possible for the Ta/TaN barrier layer 130 to remain covered with copper after the CMP process.

At this point, the method of the present invention and the method of the prior art diverge. In the prior art method, the barrier layer 30 is removed until the silicon oxide layer 28 is reached, and an etch stop barrier layer 34 is immediately deposited over the exposed surfaces of the silicon oxide layer 28, the barrier layer 30 and the metal line 33 such that the etch stop barrier layer 34 is planar, as shown in FIG. 3c. In the method of the present invention, in contrast, steps are taken to remove some of the metal line 133 and the barrier layer 130, and round off the adjacent corners of the silicon oxide layer 128, before the deposition of the etch stop barrier layer. Thus, the etch stop barrier layer is not planar, but rather has a depression where the etch stop barrier layer is deposited on the upper surface of the recessed copper, on the upper surface of the barrier layer, and on the rounded off portions of the silicon oxide layer.

More specifically, the copper of the metal line 133 is electrically polished back such that the exposed upper surface of the copper is at a level below the horizontally-oriented upper surface of the silicon oxide layer 128 (FIG. 4c; step 510). The remaining copper within the trench forms a metal line 233, or "first element," that is disposed adjacent to the silicon oxide layer 128, or "second element." The diffusion barrier layer 130 is disposed between the metal line 233 and the silicon oxide layer 128.

Next, a plasma etch is performed on the Ta/TaN barrier layer 130 and the silicon oxide layer 128 until the upper surface of the silicon oxide layer 128 is exposed and the upper surface of the barrier layer 130 within the trench has been etched down to a level below the upper surface of the silicon oxide layer 128 (step 512; FIG. 4d). In the embodiment shown in FIG. 4d, the barrier layer 130 has been etched down almost to the upper surface of the metal line 233. However, it is also within the scope of the present invention for the barrier layer 130 to be etched down some smaller distance below the upper surface of the silicon oxide layer 128.

As shown in area 142 in FIG. 4d, the etching process etches and convexly rounds the upper corner of the silicon oxide layer 128 where the silicon oxide layer 128 engages the barrier layer 130. As also shown in area 142, the upper surface of the barrier layer 130 may become concavely rounded during the etching process such that the silicon oxide layer 128 and the upper surface of the barrier layer 130 form a continuous, gradual decline or downward slope from the horizontally-oriented portion of the upper surface of the silicon oxide layer 128 down to the upper surface of the metal line 233. In one embodiment, the upper surface of the metal line 233 can be a distance d (FIG. 4d) approximately between 500 Angstroms and 1500 Angstroms below the upper surface of the silicon oxide layer 128.

Next, step 514 includes a conformal deposition of an etch stop barrier layer 144 of a substantially non-electrically conductive material, such as SiC, over the exposed upper surfaces of the silicon oxide layer 128, the Ta/TaN barrier layer 130, and the metal line 233 (FIG. 4e). As can be seen in area 142 of FIG. 4e, the etch stop barrier layer 144 conforms to the slope of the silicon oxide layer 128 and the barrier layer 130 from the upper surface of the silicon oxide layer 128 down to the upper surface of the metal line 233.

The slope of the etch stop barrier layer 144 provides the etch stop barrier layer 144 with a greater thickness in the vertical direction, identified by double arrow 146, along a junction between the first element 233 and the second element 128 than along the first element 233. More particularly, the slope of the etch stop barrier layer 144 provides the etch stop barrier layer 144 with a greater vertical thickness in the critical areas 148, 150 that are above the barrier layer 130 and/or above the portion of the silicon oxide layer 128 that engages the barrier layer 130 than in the area above the metal line 233. The etch stop barrier layer 144 is disposed with a substantially even thickness on the exposed upper surfaces of the silicon oxide layer 128, the barrier layer 130 and the metal line 233 as measured in directions perpendicular to the exposed upper surfaces. In the sloped areas 148, 150, the silicon oxide layer 128 and the barrier layer 130 have more exposed surface area per unit distance in the horizontal direction 152 than in the non-sloped areas outside of areas 148, 150. By virtue of this increased surface area per unit distance in the horizontal direction 152, the areas 148, 150 receive more of the SiC material per unit distance in the horizontal direction 152 during the deposition of the etch stop barrier layer 144. The increased amount of SiC material per unit distance in the horizontal direction 152 results in the etch stop barrier layer 144 having greater thickness as measured in the vertical direction 146 in the areas 148, 150. The etch stop barrier layer 144 can alternatively be composed of $SiO_xC_yN_z$, wherein it is possible for any one or two of x, y and z to be zero. That is, the etch stop barrier layer 144 can be composed of $SiO_xC_yN_z$, $SiO_xC_y$, $SiO_xNz$, $SiC_yN_z$, $SiO_x$, $SiC_y$, or $SiN_z$.

The greater vertical thickness in the vertical direction 146 of the etch stop barrier layer 144 can be quantified with reference to the enlarged view of FIG. 4f. If the etch stop barrier layer 144 slopes downwardly at an angle θ, then it is easily determined that cos θ=z/y, wherein z is the thickness of the etch stop barrier layer 144 in a direction perpendicular to the surface of the etch stop barrier layer 144, and y is the vertical thickness of the etch stop barrier layer 144 in the vertical direction 146. Thus, the vertical thickness y is greater than the thickness z by a factor of 1/cos θ. For example, if θ=60°, then 1/cos θ=2, and y=2z. That is, if θ=60°, then the vertical thickness y is twice as large as the thickness z.

Next, an intermetal dielectric (IMD) layer 154 (FIG. 4g) of a substantially non-electrically conductive material having a low dielectric constant K, such as $SiO_xC_yH_z$, SiOF, $SiO_x$, or carbon based film, is disposed, preferably deposited, on the etch stop barrier layer 144 over the entire surface of the wafer (step 516). The etch stop barrier layer 144 prevents diffusion of the copper of the metal line 233 into the IMD layer 154.

As illustrated in FIG. 4h, a plug hole is plasma etched in the IMD layer 154 and the etch stop barrier layer 144 in order to form a via 156 (step 518). The plasma etch proceeds through the IMD layer 154 and the etch stop barrier layer 144 in the downward vertical direction 146. Due to machine limitations, the via 156 has been inadvertently misaligned with the metal line 233, similarly to FIG. 3e. The rate of vertical progression of the etch process is slower through the etch stop barrier layer 144 than through the IMD layer 154 because the etch process is designed and optimized for the material composition of the IMD layer 154. The etch stop barrier layer 144 is over-etched to ensure that the etch stop barrier layer 144 is perforated over the upper surface of the metal line 233. More particularly, substantially all of the etch stop barrier layer 144 is removed from the upper surface of the metal line 233 in the area of the etching, thereby allowing the metal line 233 to make good electrical contact with the conductive material to be inserted into the via 156.

After the portion of the etch stop barrier layer 144 that is over the metal line 233 has been etched through or perforated, the portion of the etch stop barrier layer 144 that is in area 148 is imperforated, i.e., still has not been etched through, due to the layer's greater vertical thickness, as measured in direction 146, in the area 148. That is, the length of time required for the etch process to penetrate though an area of the etch stop barrier layer 144 is proportional to the vertical thickness of the layer, as measured in direction 146, in that area. Thus, although the etch may penetrate through and perforate the portion of the etch stop barrier layer 144 that is over the metal line 233 and that has a reduced vertical thickness, the etch still does not perforate or penetrate through the portion of the etch stop barrier layer 144 that is not over the metal line 233 and that has increased vertical thickness. The steps 510 and 512, which allow the etch stop barrier layer 144 to be formed with a gradual, continuous slope over the exposed upper surface of the barrier layer 130 and over a portion of the silicon oxide layer 128, provide the etch stop barrier layer 144 with a greater vertical thickness in the areas 148, 150. This greater vertical thickness of the etch stop barrier layer 144 inhibits the above-described microtrenching in the areas 148, 150.

Next, after the etch stop barrier layer 144 has been etched off of a portion of the upper surface of the metal line 233, the via 156 is chemically cleaned with solvents to remove any debris from the etching process (step 520). Any remaining solvents are then thoroughly removed from the via 156 (step 522). In a final step 524, the via 156 is filled with an electrically conductive material in order to form a good electrical contact with the metal line 233 through the via 156. Thus, the electrically conductive material in the via 156 is in electrical communication with the first element 233. In one embodiment, the inner surface of the via 156 is coated with a layer 158 of Ta/TaN, as shown in FIG. 4i. Finally, the remainder of the via 156 is filled with copper 160, as shown in FIG. 4j.

The method of the present invention provides a device with a faster response than a prior art device formed by the steps of FIGS. 3a–4e. The reason for the faster response is as follows: The response time of the device is proportional to its internal capacitance. Capacitance is proportional to the dielectric constant K of the material. The dielectric constant K of the SiC etch stop barrier layer 144 is higher than the dielectric constant K of the SiO layer 128. Since the high-K SiC etch stop barrier layer 144 is farther away from the metal line 233 in a device of the present invention as compared to a prior art device (compare SiC etch stop barrier layer 144 of FIG. 4e with SiC etch stop barrier layer 34 of FIG. 3c), the capacitance between adjacent metal lines 233 is lower, and the response time is therefore also lower. Conversely, the capacitance between the copper 160 in adjacent vias is greater in a device of the present invention; however, the capacitance between the copper in adjacent vias is not as critical to response time as is the capacitance between adjacent metal lines.

The present invention is described herein as increasing the vertical height of the etch stop barrier layer 144 along the edges of the copper by polishing back the copper and etching back the Ta/TaN into a recess before the deposition of the etch stop barrier layer 144. However, it is to be understood that it is within the scope of the present invention to increase the vertical height of the etch stop barrier layer 144 along the edges of the copper by other techniques. For example, it may be possible, starting with the structure of FIG. 3b, to etch back the silicon oxide layer 128 such that there is a downward slope from the upper surface of the metal line 33 to the upper surface of the silicon oxide layer 28. The subsequent barrier layer would then be sloped in the critical areas near the outside edges of the copper, and the vertical height of the barrier layer would be greater in these critical areas. It may also be possible to increase the vertical height in critical areas of an otherwise planar barrier layer by use of a mask.

The method described herein includes removing a copper layer by a CMP process, polishing back the copper into a recess, and etching the tanium/tanium nitride. However, it may also be possible within the scope of the invention to both remove the copper layer and recess the copper by polishing. Further, it may also be possible to polish away the tanium/tanium nitride.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

What is claimed is:

1. A method of making a semiconductor device, comprising:

providing a first element formed of a first substantially electrically conductive material and having an upper surface;

providing a second element adjacent to the first element, the second element being formed of a first substantially non-electrically conductive material, an upper surface of the second element sloping downwardly toward the upper surface of the first element;

disposing a first layer of a second substantially non-electrically conductive material over the upper surface of the first element and the upper surface of the second element; and performing an etching process such that the layer is perforated above the upper surface of the first element and imperforated above the downwardly sloping upper surface of the second element.

2. The method of claim 1, comprising the further step of disposing a second layer of a third substantially non-electrically conductive material over the first layer, said etching process including creating a via through the first layer and through the second layer.

3. The method of claim 2, comprising the further step of substantially filling the via with a second substantially electrically conductive material such that the second substantially electrically conductive material is in electrical communication with the first element.

4. The method of claim 2, wherein the first layer prevents diffusion of the first substantially electrically conductive material into the second layer.

5. The method of claim 1, wherein the layer has a thickness relative to a vertical direction, the thickness being greater above the downwardly sloping upper surface of the second element than above the upper surface of the first element, the etching process being performed in the vertical direction.

6. The method of claim 1, wherein the second element comprises a substrate including a channel receiving the first element.

7. The method of claim 6, comprising the further step of disposing a diffusion barrier layer in the channel, said diffusion barrier layer being disposed between the first element and the second element.

8. The method of claim 7, comprising the further step of polishing back the upper surface of the first element to a level below the upper surface of the second element, the polishing back step occurring before the step of disposing a first layer of a second substantially non-electrically conductive material.

9. The method of claim 8, comprising the further step of etching back an upper surface of the diffusion barrier layer in the channel to a level below the upper surface of the second element, the etching back step occurring before the step of disposing a first layer of a second substantially non-electrically conductve material.

10. The method of claim 9, wherein the etching back step includes etching the second element to thereby create a downward slope in the upper surface of the second element.

11. The method of claim 1, wherein the upper surface of the second element has a substantially horizontally-oriented portion disposed above a downwardly sloping portion, a vertical distance between the horizontally-oriented portion of the upper surface of the second element and the upper surface of the first element being approximately between 500 Angstroms and 1500 Angstroms.

12. A method of making a semiconductor device, comprising:

providing a first element formed of a first substantially electrically conductive material;

providing a second element adjacent to the first element, the second element being formed of a first substantially non-electrically conductive material;

disposing a first layer of a second substantially non-electrically conductive material on the first element and the second element, the layer having a thickness relative to a predetermined direction, the thickness being greater along a junction between the first element and the second element than along the first element; and performing an etching process in the predetermined direction such that the layer is perforated along the first element and imperforated along the junction between the first element and the second element.

13. The method of claim 12, wherein the predetermined direction comprises a vertical direction, the layer having a slope along the junction.

14. The method of claim 12, comprising the further step of disposing a second layer of a third substantially non-electrically conductive material over the first layer, said etching process including creating a via through the first layer and through the second layer.

15. The method of claim 14, comprising the further step of substantially filling the via with a second substantially electrically conductive material such that the second substantially electrically conductive material is in electrical communication with the first element.

16. The method of claim 14, wherein the first layer prevents diffusion of the first substantially electrically conductive material into the second layer.

17. The method of claim 12, wherein the first element comprises a metal line.

18. The method of claim 12, wherein the second element comprises a substrate including a channel receiving the first element.

19. A semiconductor device created by the steps of:

providing a first element formed of a first substantially electrically conductive material;

providing a second element adjacent to the first element, the second element being formed of a first substantially non-electrically conductive material;

disposing a layer of a second substantially non-electrically conductive material on the first element and the second element, the layer having a thickness relative to a predetermined direction, the thickness being greater along a junction between the first element and the second element than along the first element; and performing an etching process in the predetermined direction such that the layer is perforated along the first element and imperforated along the junction between the first element and the second element.

20. The dielectric of claim 19, wherein the greater thickness of the layer along the junction comprises a means for preventing the etching process from perforating the layer along the junction.

* * * * *